United States Patent
Cartina

(10) Patent No.: US 7,460,045 B1
(45) Date of Patent: Dec. 2, 2008

(54) BACKGROUND CALIBRATION TECHNIQUE FOR PIPELINED A/D CONVERTERS USING SIMPLIFIED HISTOGRAM-BASED TESTING

(75) Inventor: Dragos Cartina, Burnaby (CA)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 11/839,097

(22) Filed: Aug. 15, 2007

Related U.S. Application Data

(60) Provisional application No. 60/822,415, filed on Aug. 15, 2006.

(51) Int. Cl.
*H03M 1/10* (2006.01)

(52) U.S. Cl. ..................................... 341/120

(58) Field of Classification Search ............... 341/118, 341/119, 120, 155, 161, 162
See application file for complete search history.

(56) References Cited

U.S. PATENT DOCUMENTS

| | | | |
|---|---|---|---|
| 5,499,027 A * | 3/1996 | Karanicolas et al. | 341/120 |
| 6,184,809 B1 * | 2/2001 | Yu | 341/120 |
| 6,473,012 B2 | 10/2002 | Hellberg et al. | |
| 6,496,125 B2 | 12/2002 | Jonsson et al. | |
| 6,606,042 B2 * | 8/2003 | Sonkusale et al. | 341/120 |
| 6,621,431 B2 * | 9/2003 | Engl et al. | 341/120 |
| 6,717,536 B2 * | 4/2004 | Jonsson | 341/120 |
| 6,784,815 B2 * | 8/2004 | Jonsson | 341/120 |
| 6,784,824 B1 | 8/2004 | Quinn | |
| 6,822,601 B1 | 11/2004 | Liu et al. | |
| 6,967,603 B1 * | 11/2005 | Lin | 341/120 |
| 6,972,701 B2 * | 12/2005 | Jansson | 341/120 |
| 7,035,756 B2 * | 4/2006 | Maloberti et al. | 702/126 |
| 7,126,508 B2 * | 10/2006 | Seki | 341/118 |
| 7,224,298 B2 * | 5/2007 | Lin | 341/120 |
| 7,271,750 B1 * | 9/2007 | Ali et al. | 341/118 |
| 7,362,247 B2 * | 4/2008 | Arias et al. | 341/120 |

OTHER PUBLICATIONS

Dragos Cartina, Characterization and Digital Correction of Multi-stage Analog-to-Digital Converters, Master Engineering Thesis, 1997, Carleton University, Ottawa, Canada.

* cited by examiner

*Primary Examiner*—Linh V Nguyen
(74) *Attorney, Agent, or Firm*—Curtis B. Behmann; Borden Ladner Gervais LLP

(57) ABSTRACT

A method and apparatus are provided for calibrating a multistage A/D converter, such as a pipelined A/D converter. The method and apparatus are based on estimating the bounds of histograms of codes from various stages in the A/D converter. Known approaches were effective in calibrating A/D converters but during bound estimation suffered from lock-up conditions from which it could not recover. Embodiments of the present invention describe two mechanisms for recovering from lock-up conditions and a mechanism for fast locking. If neither a gross lock-up condition nor a fine lock-up condition is detected, the estimated bound is modified based on a comparison of a current digital residue with a fast lock value and a bound window. A discontinuity in the transfer characteristic of the A/D converter can then be removed based on the estimated bound.

23 Claims, 11 Drawing Sheets

BACKGROUND CALIBRATION TECHNIQUE FOR PIPELINED A/D CONVERTERS USING SIMPLIFIED HISTOGRAM-BASED TESTING

CROSS REFERENCE TO RELATED APPLICATIONS

This application claims the benefit of priority of U.S. Provisional Patent Application No. 60/822,415 filed Aug. 15, 2006, which is incorporated herein by reference.

FIELD OF THE INVENTION

The present invention relates generally to analog/digital (A/D) converters. More particularly, the present invention relates to calibration techniques for A/D converters.

BACKGROUND OF THE INVENTION

An analog/digital converter is an integrated circuit that converts analog continuous signals to discrete digital numbers. Such converters are used in many electronic and communication applications in which signals must be converted from the analog to digital domain, such as for processing or transmission. A digital/analog converter (DAC) is used to perform the reverse operation. In an A/D converter, or ADC, an analog input is typically converted to a digital output according to a coding scheme.

One common way of implementing an electronic ADC is a pipeline ADC, which uses two or more steps. A coarse conversion is done in a first step. In a second step, a difference between the input signal and the coarse output is determined, for example using a DAC. This difference, or analog residue, is then converted finer, and the results are combined in a last step. This type of ADC is fast, has a high resolution and only requires a small die size.

An architecture of a pipeline A/D converter with N stages can be represented as in FIG. 1. The analog input is processed in the analog domain as follows:

1. Stage 1 quantizes its input (Ain) and creates a digital output (D1).

2. Stage 1 calculates an Analog Residue (AR1) by subtracting D1 times a reference voltage from the input signal (Ain) and multiplying the result by a gain A1:

$$AR1 = A1 \cdot (Ain - D1 \cdot Vref)$$

3. Stage 2 quantizes the Analog Residue from stage 1 (AR1) and creates a digital output (D2).

4. Stage 2 calculates an Analog Residue (AR2) by subtracting D2 times a reference voltage from its input signal (AR1) and multiplying the result by a given power of 2.

$$AR2 = A2 \cdot (AR1 - D2 \cdot Vref)$$

5. The last two steps are repeated for all the remaining stages from 3 to N.

Once digital outputs of all the stages are available, they are combined together as follows:

1. The output of stage N ($D_N$) is multiplied by the weight of stage N ($2^{\wedge}n_N$) to calculate the Digital Residue of Stage N−1 ($DR_{N-1}$). Typically the weight of the last stage (N) is 1.

$$DR_{N-1} = 2^{\wedge}n_N \cdot D_N$$

2. The output of stage N−1 ($D_{N-1}$) is multiplied by the weight of stage N−1 ($2^{\wedge}n_{N-1}$) and added to the Digital Residue of Stage N−1 ($DR_{N-1}$) to calculate the Digital Residue of Stage N−2 ($DR_{N-2}$).

$$DR_{N-2} = 2^{\wedge}n_{N-1} \cdot D_{N-1} + DR_{N-1}$$

3. The last step is repeated for all the stages from N−2 to 1 until the last operation is:

$$Dout = 2^{\wedge}n_1 \cdot D_1 + DR_1$$

The final result can be expressed in the common form:

$$Dout = \sum_{j=1}^{N} 2^{\wedge}n_j \cdot D_j$$

For the following discussion, it is useful to conceptually represent the pipeline A/D converter as a first stage followed by a back-end ADC composed of all the following stages, as in FIG. 2. To understand the limitations of the pipeline A/D converter, we need to look at the transfer characteristics of a stage. We will be referring to stage 1 as this is the most important for the pipeline in terms of performance, however all other stages will have similar characteristics. Since stage 1 has two outputs, one digital (D1 in FIG. 2) and one analog (AR1 in FIG. 2), there are two transfer characteristics, as shown in FIG. 3 for a typical implementation (the so-called 1.5 bit stage).

The transfer characteristic for AR1 is not readily observable in an A/D converter. Hence it is more useful to draw the transfer characteristics of D1 and DR1 instead of D1 and AR1. As previously mentioned, the digital output of the A/D converter is calculated from the sum of DR1 and D1 times the weight of stage 1. One can easily see that if we perform this operation on the D1 and DR1 transfer characteristics in FIG. 4, the resulting transfer characteristic is the expected linear transfer characteristic of an A/D converter.

Pipeline A/D converters suffer from limited gain in the amplifiers as well as from mismatches in analog components. These cause discontinuities in the transfer characteristic of the pipeline stage as in FIG. 5 and FIG. 6. Limited gain can be alleviated by designing very high-gain amplifiers (in excess of 90 dB), which is a challenge in itself, especially when large dynamic range and high-speed operation are required at the same time. Mismatches can be reduced only by increasing the area and power of the converter, which is a very expensive option. In order to reduce the effect of mismatches by a factor of 2, one needs to increase the area and power by a factor of 4, which becomes impractical when high resolution and high speed are required at the same time.

A conventional approach is to allow these errors (both low gain in the amplifiers as well as mismatches in the design) in the analog circuitry, but to calibrate the A/D converter, i.e. to compensate for them in either the analog domain or the digital domain. This is achieved by eliminating the discontinuities in the transfer characteristics. There are several known methods that perform calibration of the A/D converter in the background. Most of these methods require some specific modifications to the analog circuitry to allow for a given calibration method. In many cases such modifications are substantial.

Some background calibration techniques such as the one presented in U.S. Pat. No. 6,822,601 "Background-Calibrating Pipelined Analog-to-Digital Converter" to Silicon Integrated Systems Corp., require applying calibration signals, which need to be digitally filtered out from the ADC output.

Other background calibration techniques such as the one presented in U.S. Pat. No. 6,496,125 "A/D conversion" to Telefonaktiebolaget L M Ericsson require an auxiliary A/D converter. The A/D conversion is switched temporarily from the main A/D converter to the auxiliary A/D converter during short time intervals used for calibration of the first A/D converter.

Other background calibration techniques such as the one presented in U.S. Pat. No. 6,473,012 "A/D converter background calibration" to Telefonaktiebolaget L M Ericsson require random time interval generators that initiate background calibration at randomly selected time instants. The missing samples need to be filled by other means.

Other background calibration techniques such as the one presented in U.S. Pat. No. 6,784,824 "Analog-to-digital converter which is substantially independent of capacitor mismatch", to Xilinx, Inc., use analog cancellation and require sampling the input signal twice.

Finally, the method presented in "Characterization and Digital Correction of Multi-Stage Analog-to-Digital Converters", Dragos Cartina, 1997, M. Eng. Thesis, Carleton University, Ottawa, does not require any specific analog changes but implements the calibration completely in the digital domain, and will be described in further detail later.

Each of U.S. Pat. Nos. 6,822,601; 6,496,125; 6,473,012; 6,784,824; as well as the Cartina publication "Characterization and Digital Correction of Multi-Stage Analog-to-Digital Converters" describe related art and each is incorporated herein by reference.

The Cartina method, which will be further described in relation to FIGS. 7-9, does not require any specific analog circuitry just for calibration purposes. For calibration purposes one needs to measure the discontinuities in the transfer characteristics (B0-B1 and B2-B3 in FIG. 7). In practice one does not have access to the digital transfer characteristics, so one cannot use them to estimate their discontinuities and correct for them. However, one can have access to the histograms of the codes at the output of the A/D converter or at various points within the converter. If one needs to calibrate stage 1, the histograms of interest are those of DR1 for each D1 value. A calibration method is based on estimating the edges of the histograms, which in this case are B0, B1, B2, and B3, as shown in FIG. 8. The x-axis of the histograms in FIG. 8 represents codes such as −1000 or 0 or +1000, while the y-axis represents the number of times a particular code occurs. For instance, in the top histogram in FIG. 8, code −1000 happens more than 80 times (the plot is clipped at 80), code 0 happens about 50 times, and code +1000 never happens. The bound B0 is the edge of the histogram for the digital output code D1=−1. The bounds B1 and B2 are the edges of the histogram for D1=0. The bound B3 is the edge of the histogram for D1=+1. The bound pairs B0,B1 and B2,B3 can be referred to as opposing histogram bounds, or bound estimates. Each of these bounds can be estimated as explained in the following.

Consider B the current estimate of the bound. If there is any occurrence DR in the particular histogram whose bounds are being estimated, perform the following update:

if DR>B−D then B=B+U else if DR>B−2·D then B=B−U else nothing where DR is the digital residue at the current time, and D and U are programmable parameters. D represents the size of the observation window, and U represents the size of the update step.

For example to estimate B0 the update is performed as follows:

if DR>B0−D then B0=B0+U else if DR>B0−2·D then B0=B0−U else nothing

Lower bounds such as B1 and B3 are processed in a very similar manner, except that the histogram is flipped horizontally before the update. In other words, the sign of DR is changed before the update.

A simple graphical description of the method above can be seen in FIG. 9. FIG. 9 can be described as a close-up view of the top histogram of FIG. 8, to better see a particular area of the histogram. In the first graph in FIG. 9 one can see that the bound estimate is too low, therefore the condition DR>B−D will happen more often than the condition {not(DR>B−D) and DR>B−2·D}, hence the bound estimate will tend to move to the right in steps of size U.

In the second graph in FIG. 9 one can see that the bound estimate is correct therefore the condition DR>B−D will happen as often as the condition {not(DR>B−D) and DR>B−2·D}, hence the bound estimate will tend to stay where it is.

Finally, in the third graph in FIG. 9 one can see that the bound estimate is too high therefore the condition DR>B−D will happen less often than the condition {not(DR>B−D) and DR>B−2·D}, hence the bound estimate will tend to move to the left in steps of size U.

There are two problems with the above-described approach, namely the presence of lock-up conditions and the long time required for locking. To see how lock-up conditions can occur, consider the case when B accidentally becomes larger than any possible value of DR. In that case neither of the conditions (DR>B−D and DR>B−2·D) will ever be true, therefore B will never change from its wrong value.

Regarding the second problem, with this algorithm there is a trade-off between the variation in the bound estimate (B) after locking and locking speed. The smaller the update step (U), the smaller the variation in the bound estimate (B) after locking, but also the longer the locking time. Conversely, the larger the update step (U), the larger the variation in the bound estimate (B) after locking, but also the shorter the locking time.

This is important because in practice both short locking times and small variation in the correction factors are desired at the same time. Since the correction factors are calculated from the bound estimates, any variation in the bound estimates will show up as variation in the correction factors.

It is, therefore, desirable to provide an improved calibration technique for pipelined A/D converters that does not suffer from lock-up conditions from which it cannot recover.

SUMMARY OF THE INVENTION

This invention improves on an existing background calibration technique by providing means to recover from lock-up conditions as well as means for fast locking.

The present invention provides a practical method and apparatus of calibrating A/D converters, which does not require dedicated analog circuitry.

In a first aspect, the present invention provides a calibration method for a multi-stage analog to digital (A/D) converter, such as a pipelined A/D converter. Each stage in the A/D converter has an analog input, a digital output, an analog residue and a digital residue. A histogram of digital residue codes is used to correct a transfer characteristic of the stage for a given digital output. A bound is estimated for a current histogram associated with a current digital output code, the estimated bound being used to estimate a discontinuity in the transfer characteristic. In response to a determination that a current digital residue occurs in the current histogram, the following steps are performed: comparing the estimated bound with a gross lock-up detection value and a fine lock-up detection characteristics; detecting whether a gross lock-up condition exists based on the comparison of the estimated bound with the gross lock-up detection value; restarting calibration in response to detection of the gross lock-up condition; in response to detection that there is no gross lock-up condition, detecting whether a fine lock-up condition exists by determining whether the current digital residue satisfies fine lock-up detection characteristics; in response to detection that there is no fine lock-up condition, modifying the estimated bound based on a comparison of the current digital residue with a fast lock value and a bound window; and removing the discontinuity in the transfer characteristic of the A/D converter based on the estimated bound.

The estimated bound can be set to be equal to the current digital residue in response to detection that the current digital residue exceeds the fast lock value. The estimated bound can be set to be equal to a previous digital residue in response to detection that the current digital residue has exceeded the fast lock value for a fast lock detection period.

In an embodiment, detecting whether the fine lock-up condition exists by determining whether the current digital residue satisfies fine lock-up detection characteristics can include the following steps: computing a count of a number of times that the current or previous digital residues for the current digital output code are detected in the current histogram and in a second histogram of the stage for a second digital output adjacent to the current digital output; determining whether the current or previous digital residues for the current digital output code are in the bound window; and detecting the fine lock-up condition when the computed count exceeds a fine lock-up detection threshold and there is no current or previous digital residue for the current digital output code in the bound window.

The estimated bound, to which the gross lock-up detection value and the fine lock-up detection characteristics are compared, can be a difference between the estimated bound and an opposing estimated bound, such as a difference between an upper histogram bound estimate and a lower histogram bound estimate.

The gross lock-up detection value can be calculated based on expected gain error, or on maximum expected mismatch in analog components in the analog to digital converter. The analog to digital converter can be a pipelined analog to digital converter.

The method steps can be repeated for each of a plurality of digital output values and/or for each stage requiring calibration. The methods described can be expanded to any number of stages to be calibrated, and to any multi-stage analog-to-digital converters.

In another aspect, the present invention provides a computer-readable medium storing statements and instructions which, when executed, cause a processor to perform a calibration method as described above.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
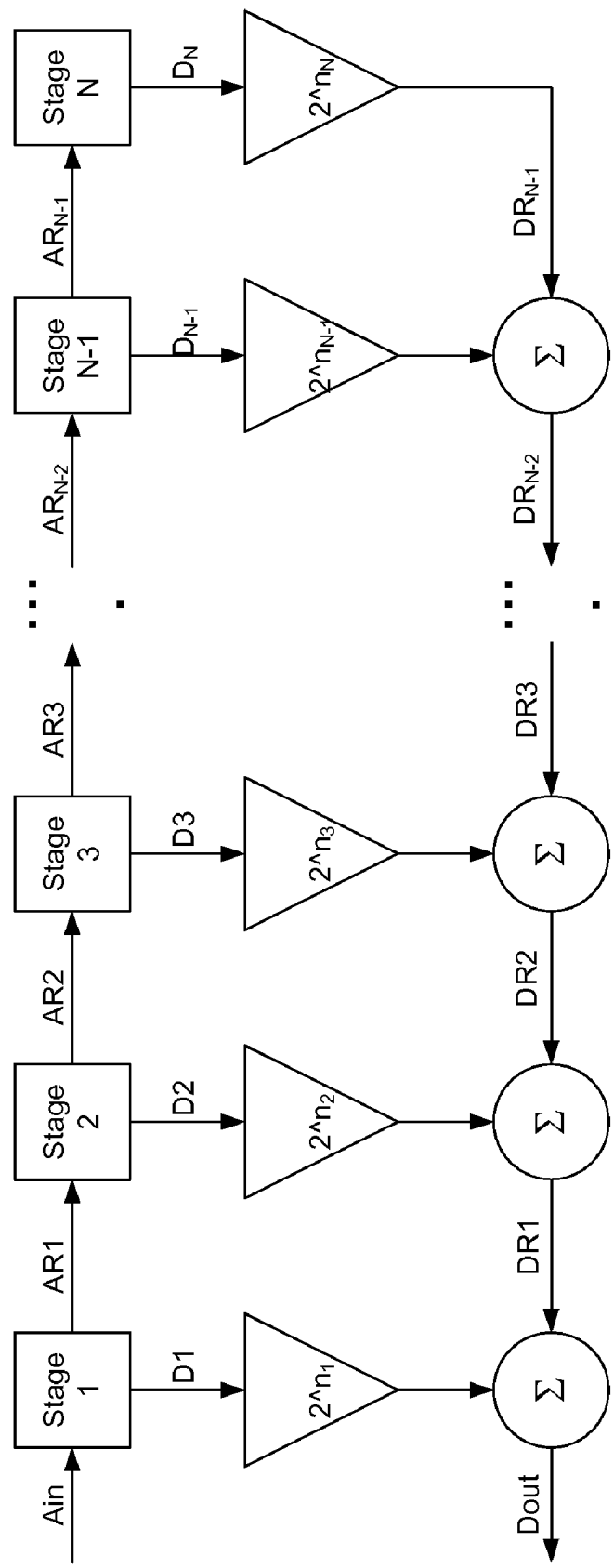
FIG. 1 illustrates is a pipeline A/D converter architecture.
Figure 2:
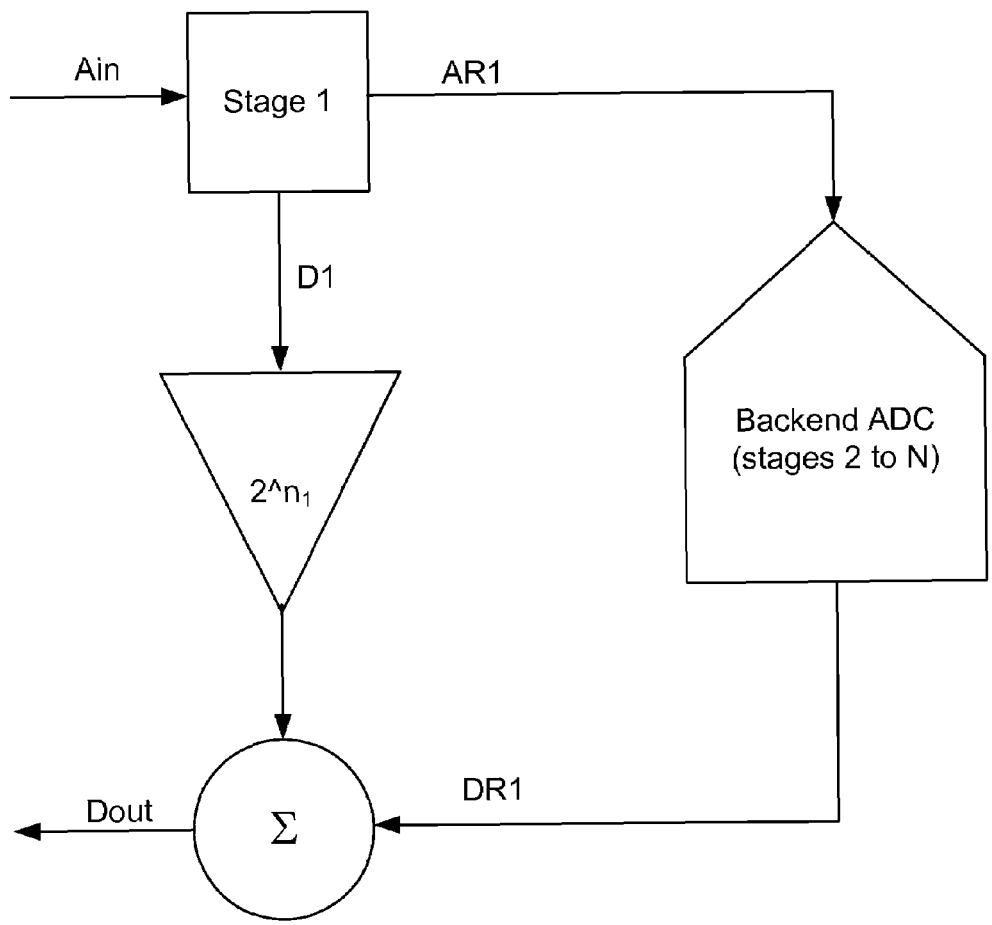
FIG. 2 illustrates a simplified model of pipeline A/D converter architecture.
Figure 3:
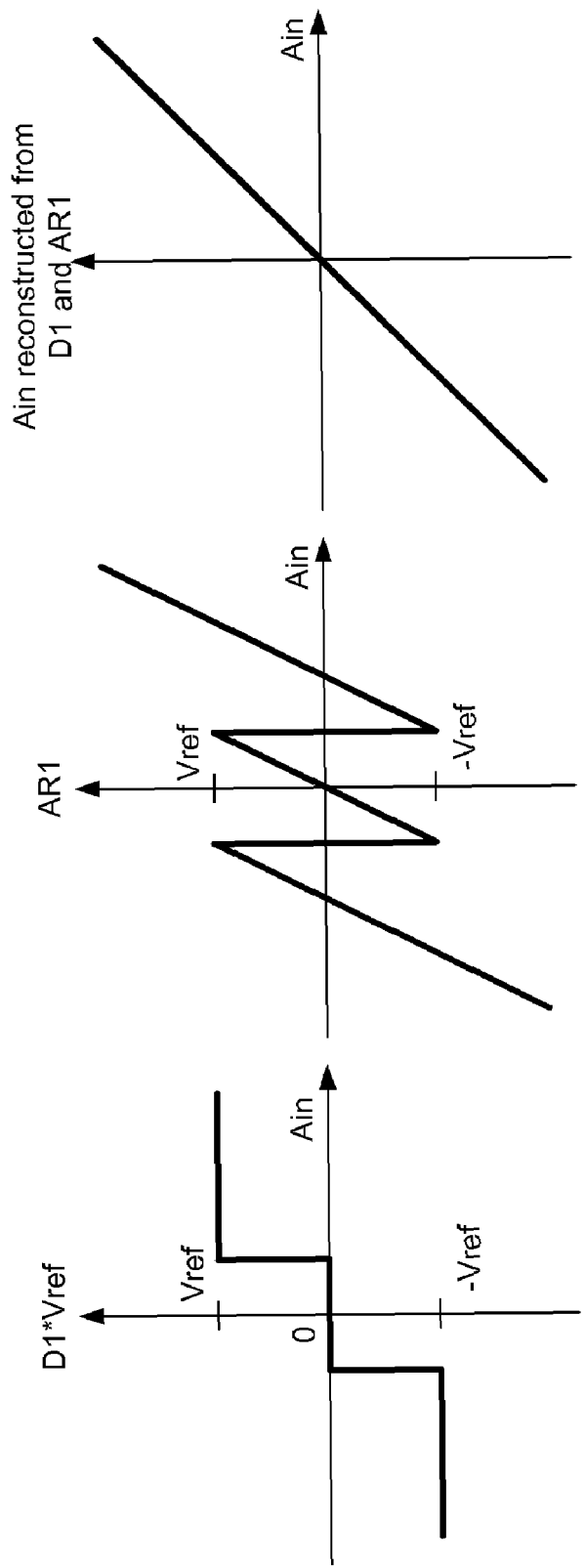
FIG. 3 illustrates ideal analog transfer characteristics of a pipeline stage.
Figure 4:
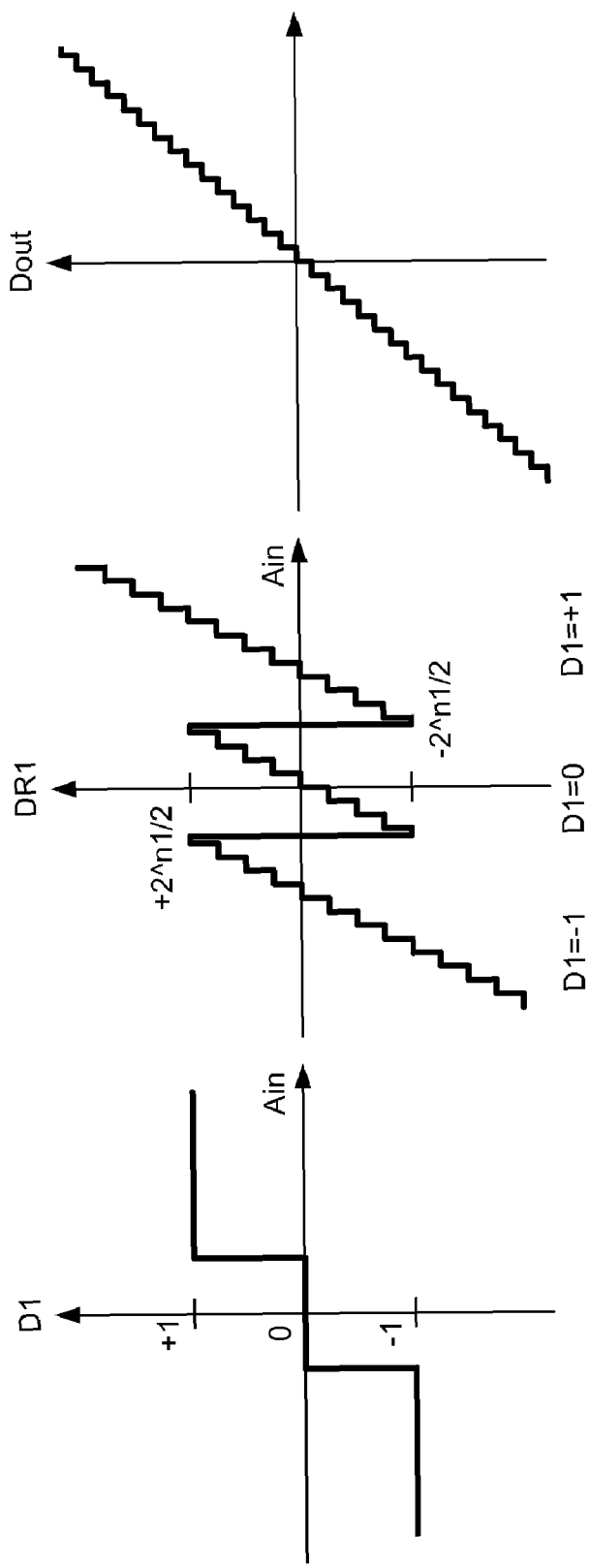
FIG. 4 illustrates ideal digital transfer characteristics of a pipeline stage.
Figure 5:
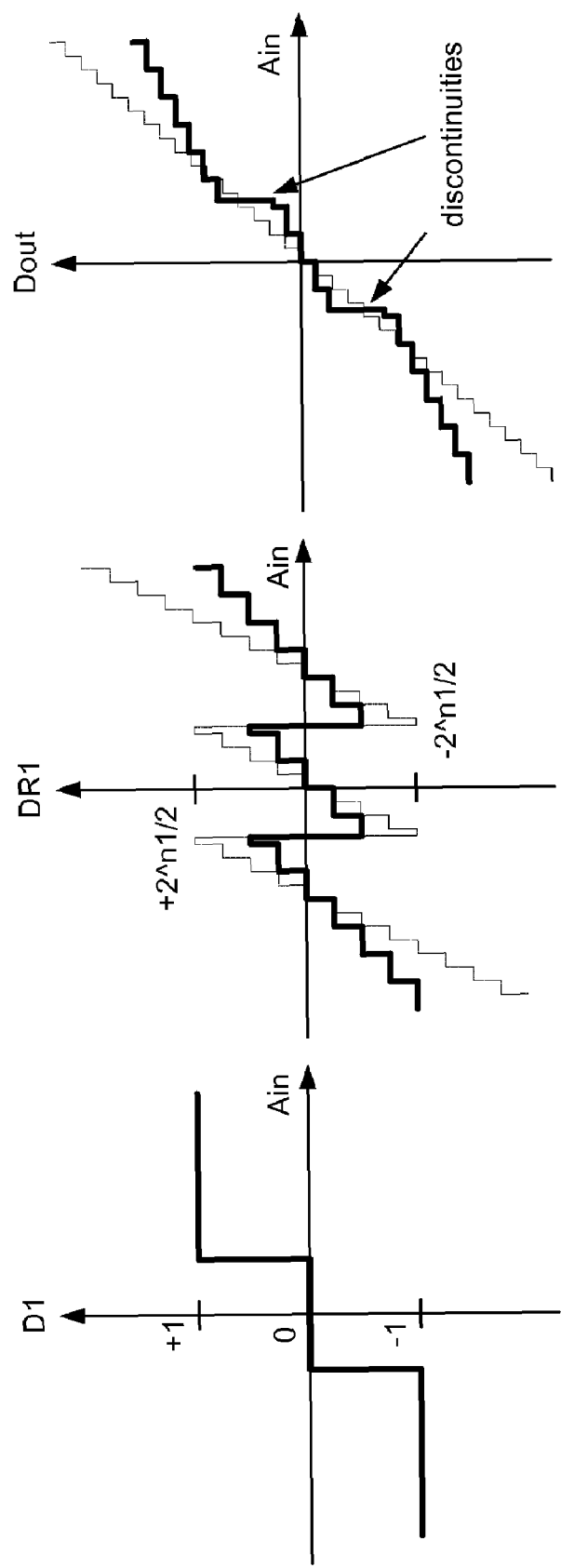
FIG. 5 illustrates digital transfer characteristics with low gain in the 1st stage.
Figure 6:
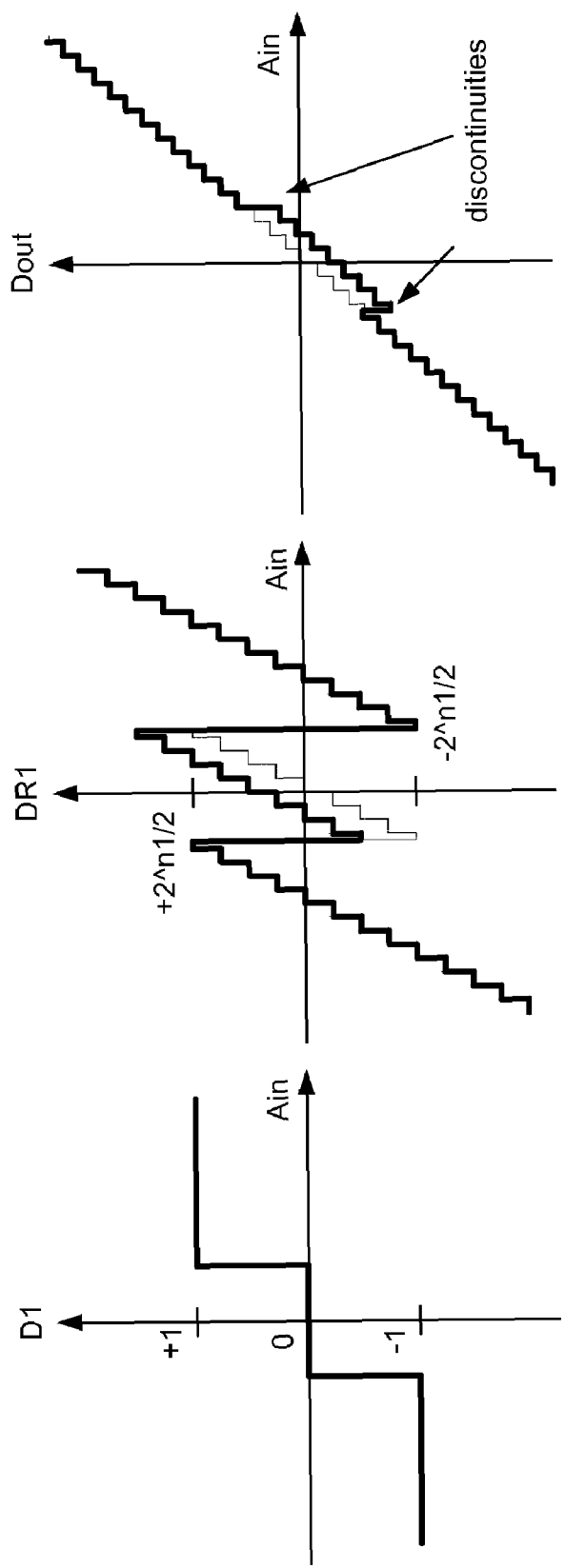
FIG. 6 illustrates digital transfer characteristics with mismatch in the 1st stage.
Figure 7:
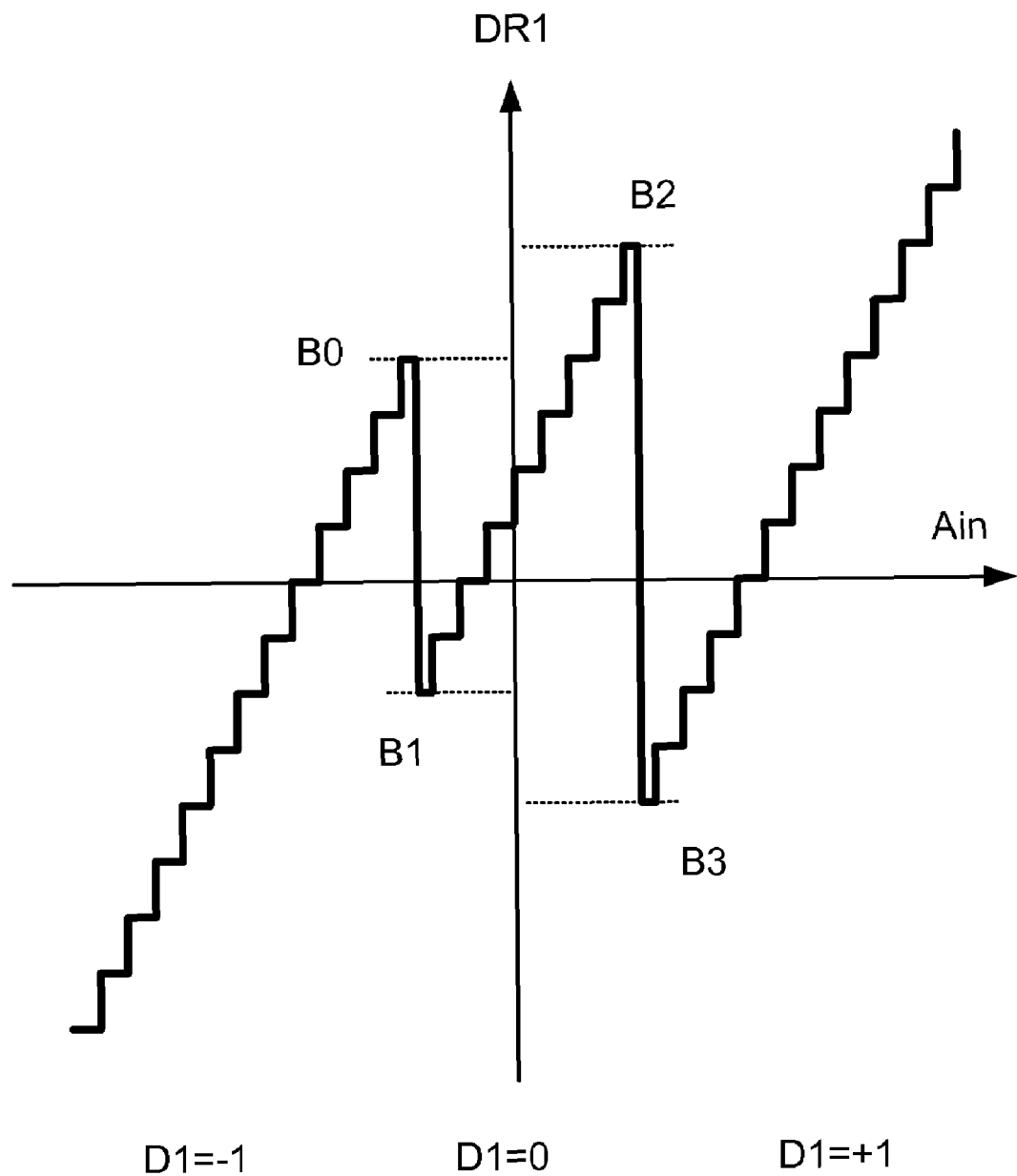
FIG. 7 illustrates a transfer characteristic of Stage 1 with bounds indicated.

Generally, the present invention provides a method and apparatus for calibrating a multi-stage A/D converter, such as a pipelined A/D converter. The method and apparatus are based on estimating the bounds of histograms of codes from various stages in the A/D converter. Known approaches were effective in calibrating A/D converters but during bound estimation suffered from lock-up conditions from which it could not recover. Embodiments of the present invention describe two mechanisms for recovering from lock-up conditions and a mechanism for fast locking. If neither a gross lock-up condition nor a fine lock-up condition is detected, the estimated bound is modified based on a comparison of a current digital residue with a fast lock value and a bound window. A discontinuity in the transfer characteristic of the A/D converter can then be removed based on the estimated bound.

A calibration approach according to embodiments of the present invention works on the premise that a transfer characteristic of a stage in a multi-stage A/D converter for a given digital output can be corrected using a histogram of digital residue codes. A bound is estimated for a current histogram associated with a current digital output code. The estimated bound is used to estimate discontinuities in the transfer characteristic. In an embodiment, the discontinuity is the difference between two adjacent bounds, minus a predetermined value. A discontinuity in the transfer characteristic of the A/D converter can then be removed based on the difference between two estimated bounds.

Embodiments of the present invention are applicable to any pipeline analog-to-digital converter. They may also be applied to other types of A/D converters that have at least two stages.

The calibration methods and systems according to embodiments of the present invention are applicable to any pipeline implementation. While 1.5 bit stage implementations are discussed, this is a non-limiting example.

The method upon which this invention improves does not require any specific analog circuitry just for calibration purposes, which means that it can be applied to any existing pipeline A/D converter that has a sample and hold stage (S/H).

The method upon which embodiments of the present invention improves is based on the following steps:
if DR>B−D then B=B+U
else if DR>B−2·D then B=B−U
else nothing where DR is the digital residue of the stage under calibration at that particular time, B is the current bound estimate, U is the update step and D is the size of the observation window. A bound window W is defined as being twice the size of the observation window, i.e. W=2·D. The bound window W extends on a histogram from B to B−2·D, with the upper half of the bound window being from B to B−D, and the lower half of the bound window being from B−D to B−2·D.

Detecting Gross Lock-Up Conditions

Gross lock-up conditions can be detected by testing the estimated bounds (B) or a function thereof against a gross lock-up detection value L, which is a programmable limit.

The simplest implementation of this is as follows:

if B>L then restart calibration

Figure 8:
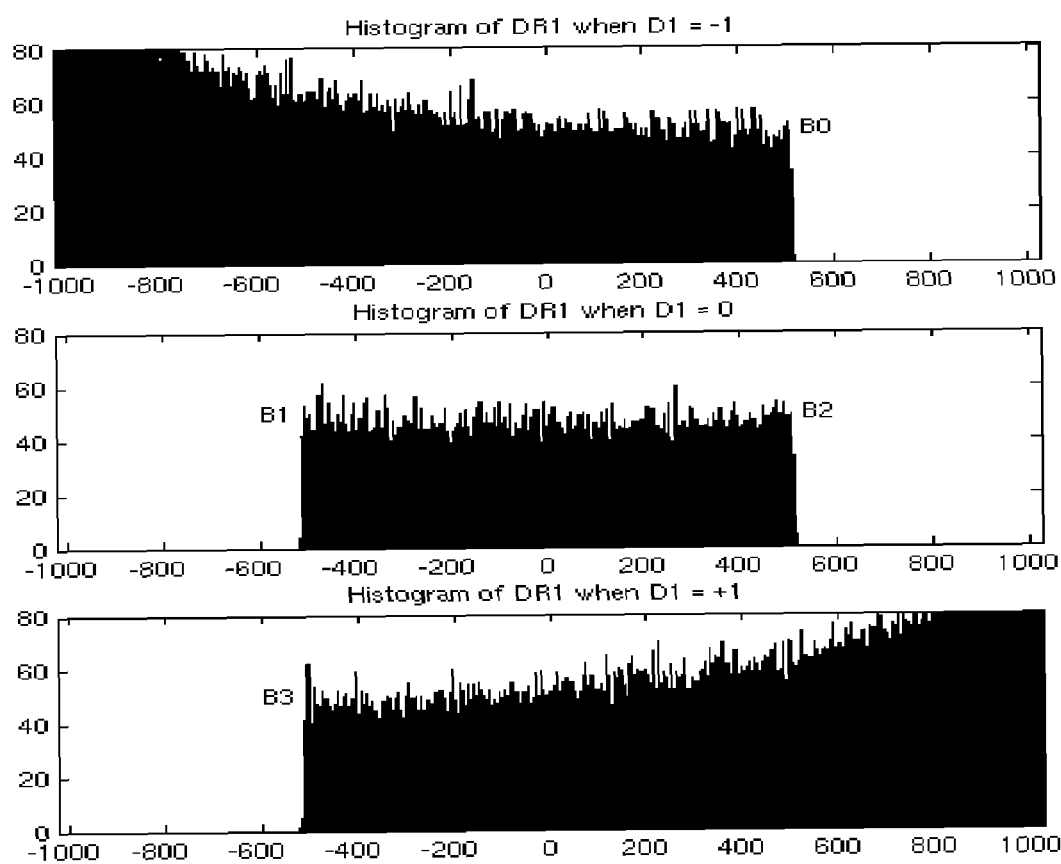
FIG. 8 illustrates histograms of a 1.5 bit pipeline ADC stage.
Figure 9:
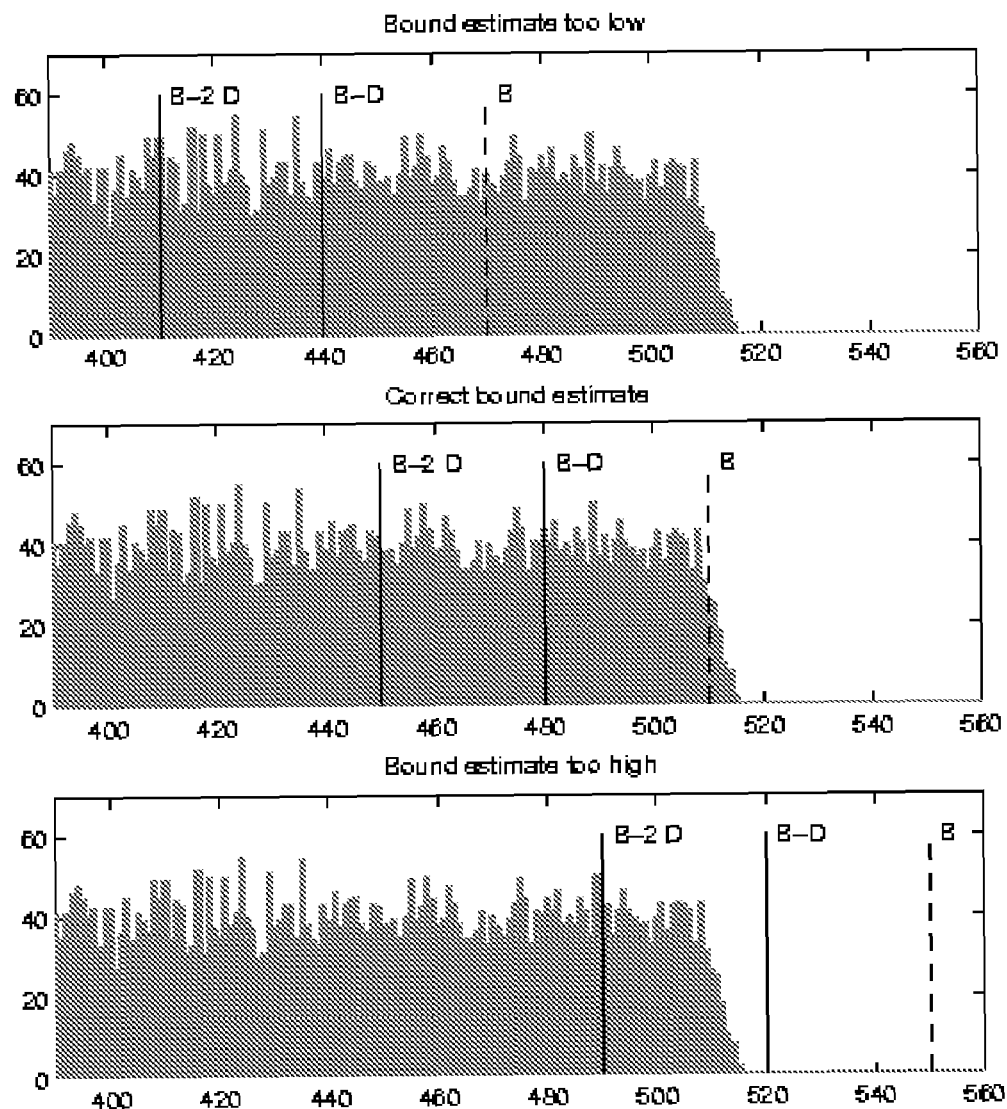
FIG. 9 illustrates a bound estimation algorithm in relation to a histogram of FIG. 8.

In an embodiment, instead of testing B, it can be more convenient to test the difference between B and the bound opposite to B against a programmable limit. Referring back to FIG. 8, one needs to test B0–B1 and B2–B3 against limits which are calculated from analog considerations such as expected gain error or maximum expected mismatch in the analog components of the pipeline.

The test therefore becomes:

if B0–B1>L then restart calibration

The programmable limit L is chosen so that it would catch most of the lock-up conditions while not triggering a calibration unless there is a lock-up condition.

Detecting Fine Lock-Up Conditions

Most lock-up conditions are gross and can be detected by the mechanism explained in the previous section. Sometimes the lock-up conditions can be under the programmable limit L but they need to be detected nevertheless to avoid any performance degradation.

A simple way to detect such conditions is based on the idea that if there is a large enough number of hits or detections of DR within the histogram corresponding to a specific D1 code, then at least one of them should be within the observation window, i.e. we should have at least one occurrence of DR>B–2·D. The explanation for this is as follows: although 2·D is very small with respect to the length of the histogram, and therefore if there is a hit anywhere in this histogram the probability of that hit meeting DR>B–2·D is very low (close to zero), however if there are K hits where K is very large, the probability of no hit meeting DR>B–2·D is also very low (close to zero). The value K can be described as a fine lock-up detection threshold.

In an embodiment, because the probability of hits in the histogram corresponding to a given code D1 may be low due to the probability density function of the input Ain, one considers not just the histogram whose bound one is trying to estimate, but also the adjoining histogram. Referring back to the first graph in FIG. 8, if one needs to estimate B0, one needs to take into account not just the number of hits in the histogram corresponding to D1=–1 but also the number of hits in the histogram corresponding to D1=0. These conditions can be referred to as fine lock-up detection characteristics.

The method works as follows:

if (there have been at least K hits either in the histogram D1=–1 or in the histogram D1=0) and no hit in D1=–1 meeting the condition DR>B–2·D then reset B Fast Lock A simple means of achieving fast lock is to add a test to the original method as follows:

if DR>B+D2 then B=DR
   else if DR>B–D then B=B+U
   else if DR>B–2·D then B=B–U
   else nothing where D2 is a fast lock parameter, which is a programmable parameter, and the sum B+D2 is referred to as a fast lock value. The test that was added (DR>B+D2) identifies cases where the DR is so far from its final value that there is no need to go there in small steps of size U, but one can jump directly to the current DR value.

Another embodiment includes a modification of the above method, and has the additional advantage that it would filter out possible wrong DR codes if they ever occur. This embodiment can be described by the following steps:

if DR>B+D2 at least M times then B=last(DR)
   else if DR>B–D then B=B+U
   else if DR>B–2·D then B=B·U
   else nothing where M is a fast lock occurrence threshold, which is another programmable parameter. The method counts a number of times the digital residue exceeds the fast lock value. When that count exceeds the fast lock occurrence threshold, the value of B is set to the previous, or last, DR.

Alternatively, one can use the fast lock feature during start-up and afterward disable it.

Background Calibration Technique

Figure 10:
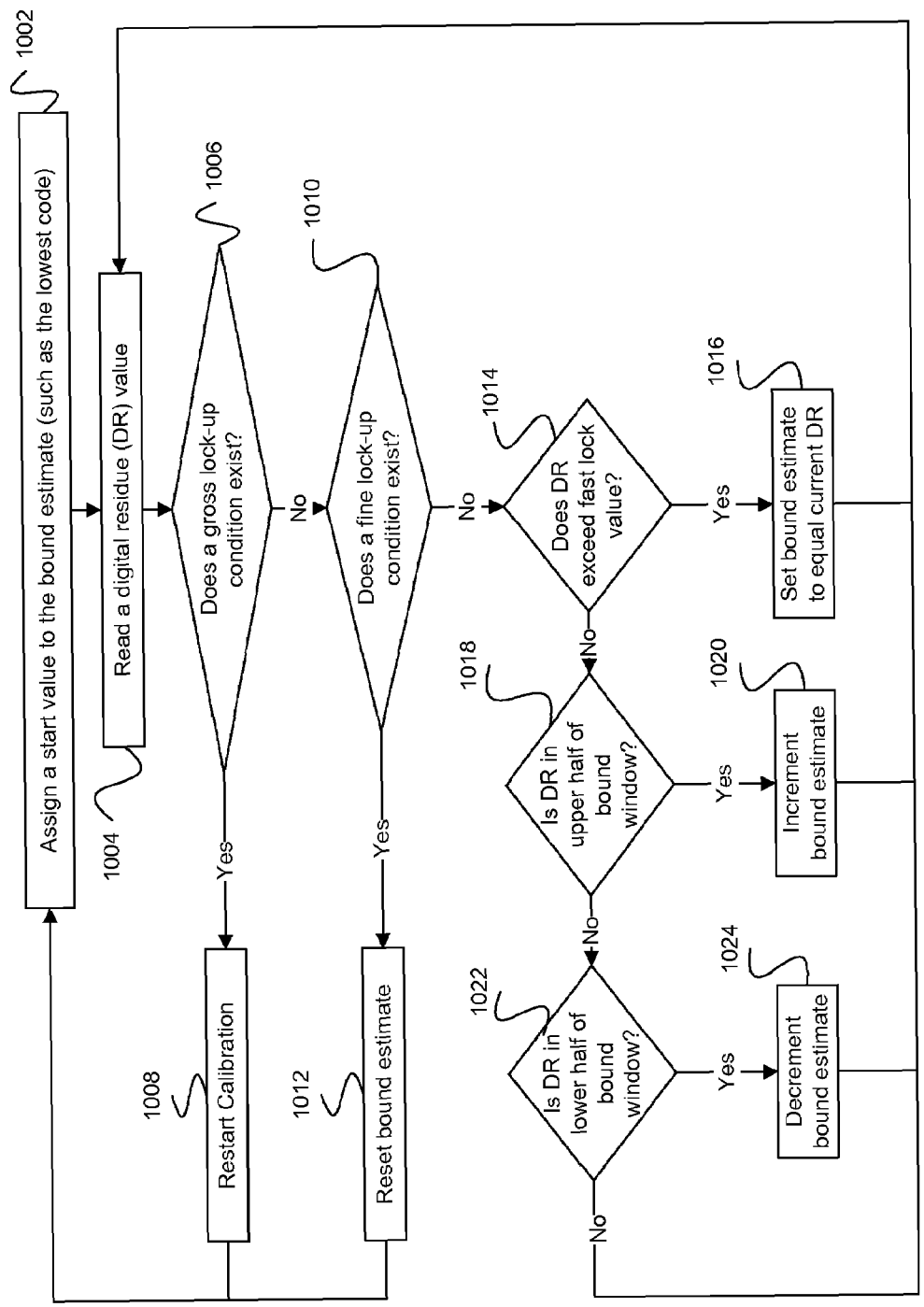
FIG. 10 illustrates a flowchart of a calibration method for a stage in a multi-stage A/D converter according to an embodiment of the present invention.

FIG. 10 illustrates a flowchart of a calibration method for a multi-stage A/D converter according to an embodiment of the present invention. The method in FIG. 10 is a general representation of the operations provided below, which can be described as a background calibration technique that includes the following operations to be performed for every cycle when D1=–1:

if B0–B1>L then restart calibration
   else if (there have been at least N hits either in the histogram D1=–1 or in the histogram D1=0) and no hit in D1=–1 meeting the condition DR>B0–2·D then reset B0
   else if DR>B0+D2 at least M times then B0=last(DR)
   else if DR>B0–D then B0=B0+U
   else if DR>B0–2·D then B0=B0–U
   else nothing In step 1002 of FIG. 10, a start value is assigned for a bound B to be estimated for a histogram for a given digital output code. This step can be performed for each bound B0, B1, B2 and B3, as well as for digital output codes D1=–1, D1=0 and D1=1. In step 1004, a digital residue (DR) value is read. Steps are taken to determine whether a gross lock-up condition exists, in step 1006, and whether a fine lock-up condition exists, in step 1008. These determinations can include comparing the estimated bound with a gross lock-up detection value, and with a fine lock-up detection value. If a gross lock-up condition has been detected in step 1006, the method restarts calibration, as shown in step 1008. If a fine lock-up condition exists, the bound estimate is reset in step 1012, returning the method to step 1002. If neither a gross lock-up condition nor a fine lock-up condition has been detected in steps 1006 and 1008, further steps are taken to determine whether the bound estimate should be changed.

Step 1014 detects whether a fast lock can be achieved, by determining if the current digital residue DR exceeds a fast lock value. If the current DR exceeds the fast lock value, the bound estimate B is set to equal the current DR value in step 1016. In an optional step (not illustrated), a determination is made whether the current DR has exceeded the fast lock value at least M times, which is the fast lock occurrence threshold. If yes, the bound estimate is set to be equal to the previous, or last, DR value. If the current DR does not exceed the fast lock value, it is determined in steps 1018 and 1022 whether the DR is in the upper half of a bound window, or the lower half of the bound window. The bound estimate is incremented in step 1020 if the DR is in the upper half of the bound window. The bound estimate is decremented in step 1024 if the DR is in the lower half of the bound window. If step 1020 determines that the DR is not in the lower half of the bound window, the method returns to step 1004 to read another DR value. The method also returns to step 1004 after completion of steps 1016, 1020, and 1024.

Figure 11:
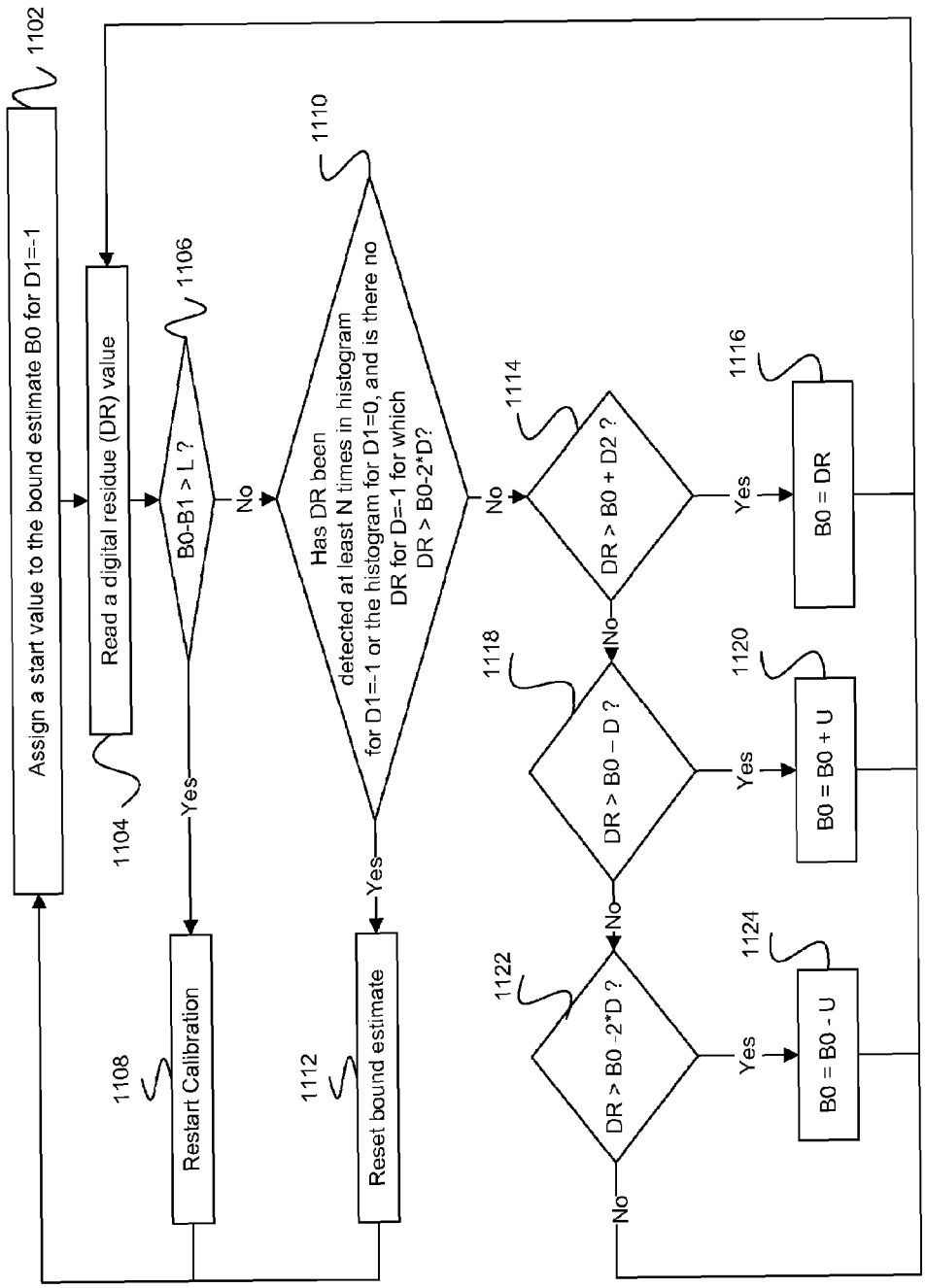
FIG. 11 illustrates a flowchart of a calibration method for a stage in a multi-stage A/D converter according to another embodiment of the present invention.

FIG. 11 illustrates a flowchart of a calibration method for a multi-stage A/D converter according to another embodiment of the present invention. The method in FIG. 11 is similar to FIG. 10, but shows details of operation in a particular embodiment. In step 1102, a start value is assigned to a bound estimate B0 for a histogram for a given digital output code D1=−1. In step 1104, a function B0−B1 of the estimated bound B0 is compared with a gross lock-up detection value L. If step 1106 determines that B0 exceeds L, calibration is restarted in step 1008, since this means that a gross lock-up condition has been detected, and the method returns to step 1002. If step 1106 does not detect a gross lock-up condition, the method proceeds to step 1108.

Step 1108 determines whether the current digital residue satisfies two fine lock-up detection characteristics First, it is determined whether DR has been detected at least K times in the histogram for D1=−1 (the histogram for the current digital output) or in the histogram for D1=0 (the adjoining histogram). Second, it is determined whether there is no DR for D1=−1 (the current digital output) for which DR>B0−2·D. If either or both of the determinations in step 1108 is negative, the bound estimate is reset, as shown in step 1112, since a fine lock-up condition has not occurred, and the method returns to step 1002. If both determinations in step 1108 are positive, this means that a fine lock-up condition has not been detected, and that the estimated bound B0 should be updated. The manner in which the estimated bound is updated is determined in relation to further steps.

In step 1114, it is determined whether DR exceeds the fast lock value, i.e. DR>B0+D2. If so, then the value of B0 is updated in step 1116 to equal the value of the current digital residue DR. In an embodiment (not shown in FIG. 11), a determination is made whether the condition DR>B+D2 has occurred at least M times. If so, the value of B0 is updated to equal the previous value of DR. Returning to FIG. 11, if it is determined in step 1114 that the current digital residue is less than or equal to the fast lock value, the method proceeds to step 1118 in which it is determined whether DR>B0−D. If the current digital residue is greater than a difference between the estimated bound and the observation window size, i.e. is in an upper half of the bound window, then the value of B0 is incremented in step 1120 by an update step size U. If the current digital residue is less than or equal to a difference between the estimated bound and the observation window size, a further determination is made in step 1122 whether DR>B0−2·D. If the current digital residue is less than or equal to a difference between the estimated bound and two times the observation window size, i.e. is in the lower half of the bound window, the value of B0 is decremented in step 1124 by an update step size U. If step 1120 determines that the DR is not in the lower half of the bound window, the method returns to step 1104 to read another DR value. The method also returns to step 1104 after completion of steps 1116, 1120, and 1124.

Note that the order of the operations of the steps in both FIG. 10 and FIG. 11 can be changed. Also, embodiments of the present invention may use only some of the features and not necessarily all of them. Similar equations and expressions can be written for cycles for which D1=0 or D1=+1 or if there are more than three possible values, similar equations can be written for any possible value of D1.

Note that if more than one stage needs to be calibrated, the method steps can be applied to all stages requiring calibration.

Embodiments of the present invention provide a purely digital means to overcome analog limitations such as limited gain and mismatches. As such they can be applied to any pipeline analog-to-digital converters or indeed to any multi-stage analog-digital converters. They can also be retrofitted to existing converters without requiring specific analog changes.

In the above description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

Other embodiments of the present invention can be provided as an apparatus, or system. In one embodiment, the apparatus comprises a processor and a computer-readable medium. The computer-readable medium stores statements and instructions which, when executed, cause the processor to perform a calibration method for a multi-stage A/D converter, as described above.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A calibration method for a multi-stage analog to digital (A/D) converter, each stage having an analog input, a digital output, an analog residue and a digital residue, a histogram of digital residue codes being used to correct a transfer characteristic of the stage for a given digital output, the method comprising:

estimating a bound for a current histogram associated with a current digital output code, the estimated bound being used to estimate a discontinuity in the transfer characteristic;

in response to a determination that a current digital residue occurs in the current histogram:

comparing the estimated bound with a gross lock-up detection value and a fine lock-up detection characteristics;

detecting whether a gross lock-up condition exists based on the comparison of the estimated bound with the gross lock-up detection value;

restarting calibration in response to detection of the gross lock-up condition;

in response to detection that there is no gross lock-up condition, detecting whether a fine lock-up condition exists by determining whether the current digital residue satisfies fine lock-up detection characteristics;

in response to detection that there is no fine lock-up condition, modifying the estimated bound based on a comparison of the current digital residue with a fast lock value and a bound window; and removing the discontinuity in the transfer characteristic of the A/D converter based on the estimated bound.

2. The method of claim 1 wherein modifying the estimated bound comprises setting the estimated bound to equal the current digital residue in response to detection that the current digital residue exceeds the fast lock value.

3. The method of claim 1 wherein modifying the estimated bound comprises setting the estimated bound to equal a previous digital residue in response to detection that the current digital residue has exceeded the fast lock value for a fast lock detection period.

4. The method of claim 1 wherein detecting whether the fine lock-up condition exists by determining whether the current digital residue satisfies fine lock-up detection characteristics comprises:

computing a count of a number of times that the current or previous digital residues for the current digital output code are detected in the current histogram and in a second histogram of the stage for a second digital output adjacent to the current digital output;

determining whether the current or previous digital residues for the current digital output code are in the bound window; and detecting the fine lock-up condition when the computed count exceeds a fine lock-up detection threshold and there is no current or previous digital residue for the current digital output code in the bound window.

5. The method of claim 1 wherein comparing the estimated bound with the gross lock-up detection value and the fine lock-up detection characteristics comprises comparing the gross lock-up detection value and the fine lock-up detection characteristics with a difference between the estimated bound and an opposing estimated bound.

6. The method of claim 1 wherein the estimated bound comprises a difference between an upper histogram bound estimate and a lower histogram bound estimate.

7. The method of claim 1 wherein the gross lock-up detection value is calculated based on expected gain error.

8. The method of claim 1 wherein the gross lock-up detection value is calculated based on maximum expected mismatch in analog components in the analog to digital converter.

9. The method of claim 1 wherein the analog to digital converter comprises a pipelined analog to digital converter.

10. The method of claim 1 wherein the steps are repeated for each of a plurality of digital output values.

11. The method of claim 1 wherein the steps are repeated for each stage requiring calibration.

12. A computer-readable medium storing statements and instructions which, when executed, cause a processor to perform a calibration method for a multi-stage analog to digital (A/D) converter, each stage having an analog input, a digital output, an analog residue and a digital residue, a histogram of digital residue codes being used to correct a transfer characteristic of the stage for a given digital output, the method comprising:

estimating a bound for a current histogram associated with a current digital output code, the estimated bound being used to estimate a discontinuity in the transfer characteristic;

in response to a determination that a current digital residue occurs in the current histogram:

comparing the estimated bound with a gross lock-up detection value and a fine lock-up detection characteristics;

detecting whether a gross lock-up condition exists based on the comparison of the estimated bound with the gross lock-up detection value;

restarting calibration in response to detection of the gross lock-up condition;

in response to detection that there is no gross lock-up condition, detecting whether a fine lock-up condition exists by determining whether the current digital residue satisfies fine lock-up detection characteristics;

in response to detection of that there is no fine lock-up condition, modifying the estimated bound based on a comparison of the current digital residue with a fast lock value and a bound window; and removing the discontinuity in the transfer characteristic of the A/D converter based on the estimated bound.

13. The computer readable medium of claim 12 wherein, in the method, modifying the estimated bound comprises setting the estimated bound to equal the current digital residue in response to detection that the current digital residue exceeds the fast lock value.

14. The computer readable medium of claim 12 wherein, in the method, modifying the estimated bound comprises setting the estimated bound to equal a previous digital residue in response to detection that the current digital residue has exceeded the fast lock value for a fast lock detection period.

15. The computer readable medium of claim 12 wherein, in the method, detecting whether the fine lock-up condition exists by determining whether the current digital residue satisfies fine lock-up detection characteristics comprises:

computing a count of a number of times that the current or previous digital residues for the current digital output code are detected in the current histogram and in a second histogram of the stage for a second digital output adjacent to the current digital output;

determining whether the current or previous digital residues for the current digital output code are in the bound window;

detecting the fine lock-up condition when the computed count exceeds a fine lock-up detection threshold and there is no current or previous digital residue for the current digital output code in the bound window.

16. The computer readable medium of claim 12 wherein, in the method, comparing the estimated bound with the gross lock-up detection value and the fine lock-up detection characteristics comprises comparing the gross lock-up detection value and the fine lock-up detection characteristics with a difference between the estimated bound and an opposing estimated bound.

17. The computer readable medium of claim 12 wherein, in the method, the estimated bound comprises a difference between an upper histogram bound estimate and a lower histogram bound estimate.

18. The computer readable medium of claim 12 wherein, in the method, the gross lock-up detection value is calculated based on expected gain error.

19. The computer readable medium of claim 12 wherein, in the method, wherein the gross lock-up detection value is calculated based on maximum expected mismatch in analog components in the analog to digital converter.

20. The computer readable medium of claim 12 wherein, in the method, the analog to digital converter comprises a pipelined analog to digital converter.

21. The computer readable medium of claim 12 wherein, in the method, the current bound estimate is incremented or decremented by a bound update step size.

22. The computer readable medium of claim 12 wherein the method steps are repeated for each of a plurality of digital output values.

23. The computer readable medium of claim 12 wherein the method steps are repeated for each stage requiring calibration.

* * * * *